US010790353B2

(12) United States Patent
Poelzl et al.

(10) Patent No.: US 10,790,353 B2
(45) Date of Patent: Sep. 29, 2020

(54) SEMICONDUCTOR DEVICE WITH SUPERJUNCTION AND OXYGEN INSERTED SI-LAYERS

(71) Applicant: Infineon Technologies Austria AG, Villach (AT)

(72) Inventors: Martin Poelzl, Ossiach (AT); Robert Haase, San Pedro, CA (US); Sylvain Leomant, Poertschach am Woerthersee (AT); Maximilian Roesch, St. Magdalen (AT); Ravi Keshav Joshi, Klagenfurt (AT); Andreas Meiser, Sauerlach (DE); Xiaoqiu Huang, Plano, TX (US); Ling Ma, Redondo Beach, CA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/185,610

(22) Filed: Nov. 9, 2018

(65) Prior Publication Data

US 2020/0152733 A1    May 14, 2020

(51) Int. Cl.
 *H01L 29/06* (2006.01)
 *H01L 29/78* (2006.01)
 (Continued)

(52) U.S. Cl.
 CPC ...... *H01L 29/0634* (2013.01); *H01L 29/0696* (2013.01); *H01L 29/0865* (2013.01);
 (Continued)

(58) Field of Classification Search
 CPC ........... H01L 29/66734; H01L 29/0696; H01L 29/0882; H01L 29/0865; H01L 29/7397;
 (Continued)

(56) References Cited

U.S. PATENT DOCUMENTS 6,404,007 B1 * 6/2002 Mo .................. H01L 21/28202
                                                        257/324
7,858,478 B2    12/2010 Hirler
                 (Continued)

FOREIGN PATENT DOCUMENTS

| DE | 102006002903 A1 | 8/2007 |
| DE | 102007044414 A1 | 3/2009 |
| WO | 2009079465 A1 | 6/2009 |

OTHER PUBLICATIONS

Datta, Suman, "Mitigation of Intrinsic Vt Variation using Oxygen Inserted (OI) Silicon Channel", University of Notre Dame, IEEE IEDM conference in San Francisco, CA, USA, Dec. 2017, accessed online at http://blog.atomera.com/wp-content/uploads/2017/12/2017-IEDM-Seminar-Suman-20171204.pdf on Aug. 8, 2018.
(Continued)

*Primary Examiner* — Vongsavanh Sengdara
(74) *Attorney, Agent, or Firm* — Murphy, Bilak & Homiller, PLLC

(57) ABSTRACT

A semiconductor device includes a source region and a drain region of a first conductivity type, a body region of a second conductivity type between the source region and the drain region, a gate configured to control current through a channel of the body region, a drift zone of the first conductivity type between the body region and the drain region, a superjunction structure formed by a plurality of regions of the second conductivity type laterally spaced apart from one another by intervening regions of the drift zone, and a diffusion barrier structure disposed along sidewalls of the regions of the second conductivity type of the superjunction structure. The diffusion barrier structure includes alternating layers of Si and oxygen-doped Si and a Si capping layer on the alternating layers of Si and oxygen-doped Si.

11 Claims, 22 Drawing Sheets

(51) Int. Cl.
*H01L 29/423* (2006.01)
*H01L 29/10* (2006.01)
*H01L 29/739* (2006.01)
*H01L 29/08* (2006.01)
*H01L 29/66* (2006.01)

(52) U.S. Cl.
CPC ...... *H01L 29/0882* (2013.01); *H01L 29/1095* (2013.01); *H01L 29/4236* (2013.01); *H01L 29/66734* (2013.01); *H01L 29/7397* (2013.01); *H01L 29/7813* (2013.01)

(58) Field of Classification Search
CPC ............. H01L 29/1095; H01L 29/4236; H01L 29/7813; H01L 29/0634
See application file for complete search history.

(56) References Cited

U.S. PATENT DOCUMENTS

| | | | |
|---|---|---|---|
| 8,067,800 B2 | 11/2011 | Hsieh | |
| 10,573,742 B1 | 2/2020 | Feil et al. | |
| 2004/0031987 A1* | 2/2004 | Henninger | H01L 29/407 257/328 |
| 2004/0166636 A1* | 8/2004 | Darwish | H01L 21/28194 438/270 |
| 2005/0167742 A1 | 8/2005 | Challa et al. | |
| 2007/0249142 A1 | 10/2007 | Hisanaga | |
| 2012/0061754 A1* | 3/2012 | Hsieh | H01L 29/66734 257/331 |
| 2012/0064684 A1* | 3/2012 | Hsieh | H01L 29/42368 438/270 |
| 2012/0074489 A1* | 3/2012 | Hsieh | H01L 29/7811 257/330 |
| 2012/0187477 A1* | 7/2012 | Hsieh | H01L 29/41766 257/331 |
| 2012/0280293 A1 | 11/2012 | Pan | |
| 2013/0168760 A1* | 7/2013 | Hsieh | H01L 29/42368 257/330 |
| 2013/0313632 A1* | 11/2013 | Schulze | H01L 29/66712 257/329 |
| 2015/0270378 A1 | 9/2015 | Konishi et al. | |
| 2017/0263720 A1 | 9/2017 | Hirler et al. | |

OTHER PUBLICATIONS

Havanur, Sanjay, et al., "Power MOSFET Basics Understanding Superjunction Technology", Vishay Siliconix, Device Application Note AN849, accessed online at https://www.vishay.com/docs/66864/an849.pdf on Jul. 2, 2019, pp. 1-5.

Takeuchi, Hideki, et al., "Punch-Through Stop Doping Profile Control via Interstitial Trapping by Oxygen-Insertion Silicon Channel", 2017 IEEE Electron Devices Technology and Manufacturing Conference (EDTM), Feb. 28-Mar. 2, 2017, pp. 1-6.

Xu, Nuo, et al., "Extension of Planar Bulk n-Channel MOSFET Scaling With Oxygen Insertion Technology", IEEE Transactions on Electron Devices, vol. 61, No. 9, Sep. 2014, pp. 3345-3349.

Xu, N., et al., "MOSFET Performance and Scalability Enhancement by Insertion of Oxygen Layers", 2012 International Electron Devices Meeting, San Francisco, CA, USA, Dec. 2012.

Shao, Lin, et al., "Boron diffusion in silicon: the anomalies and control by point defect engineering", Reports: A Review Journal, Materials Science and Engineering R 42, Aug. 11, 2003, pp. 65-114.

* cited by examiner

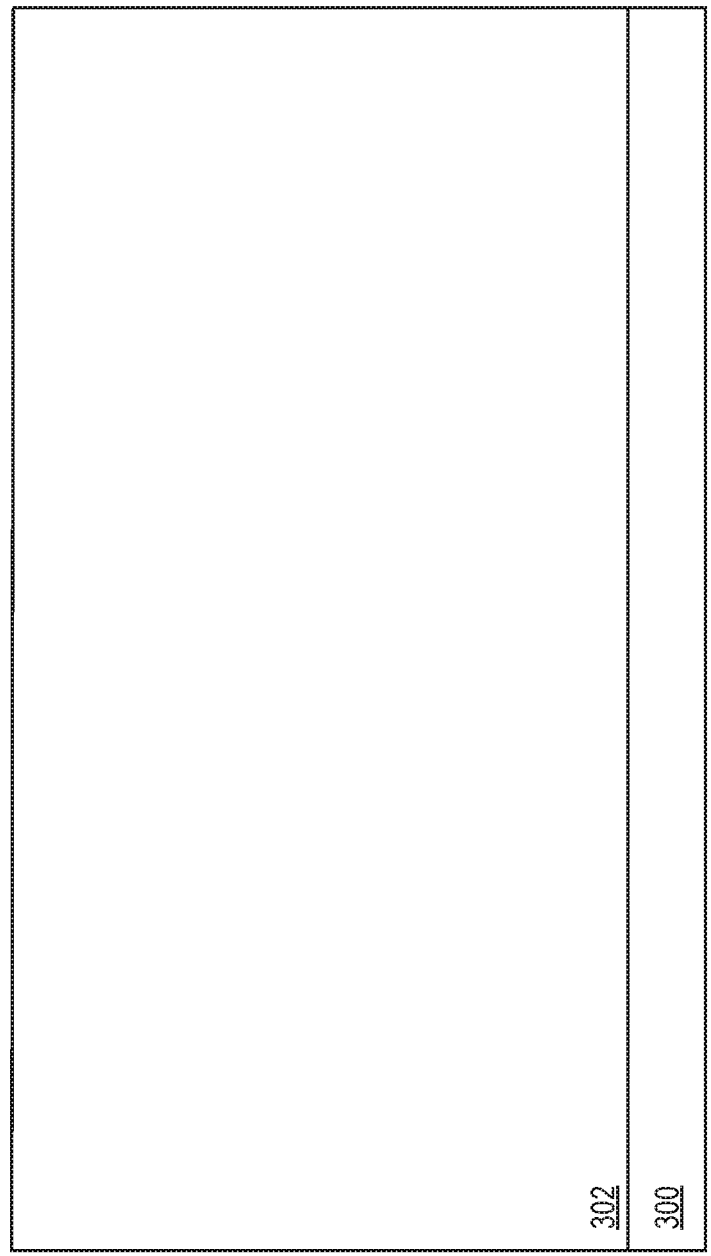

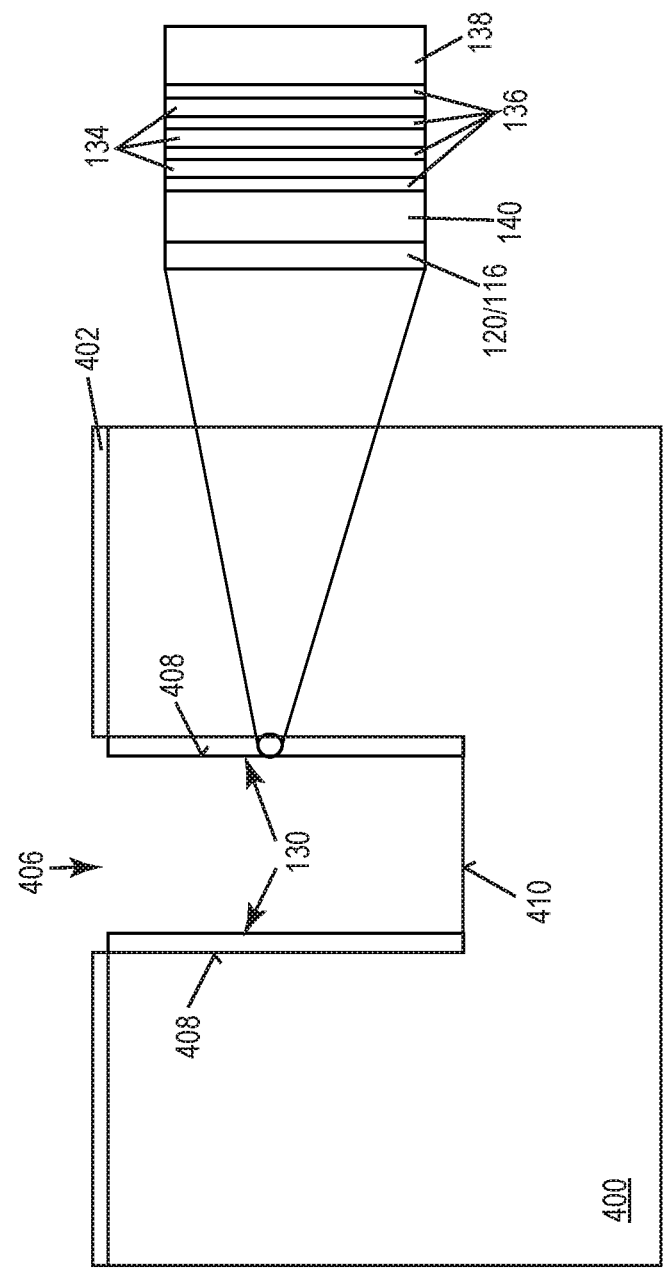

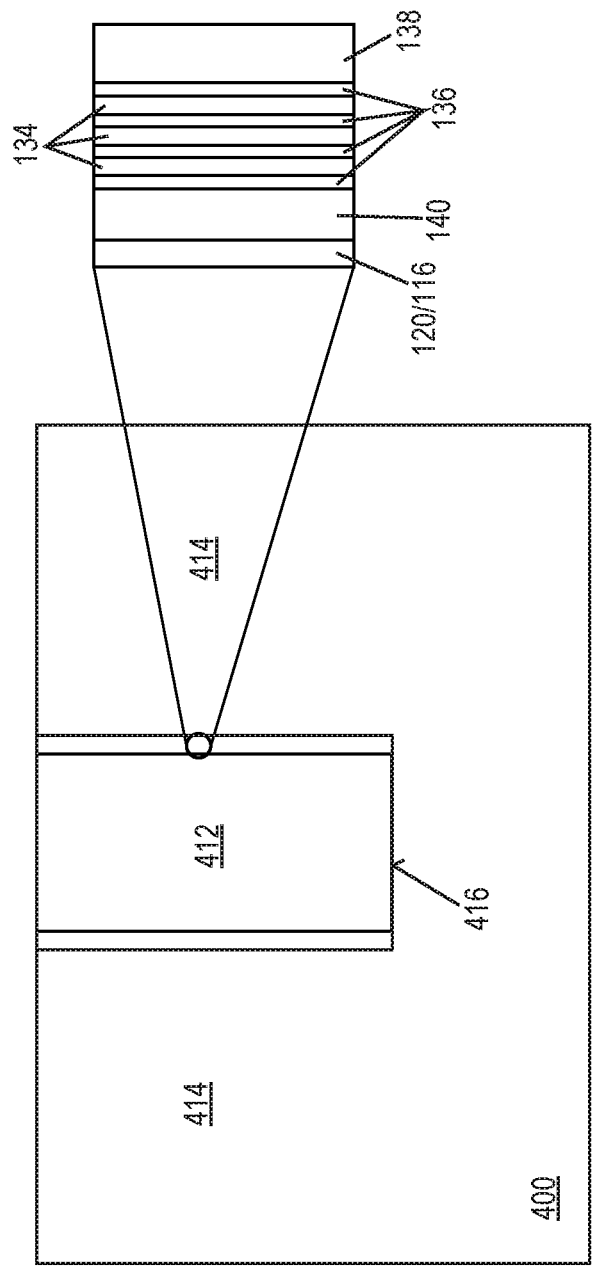

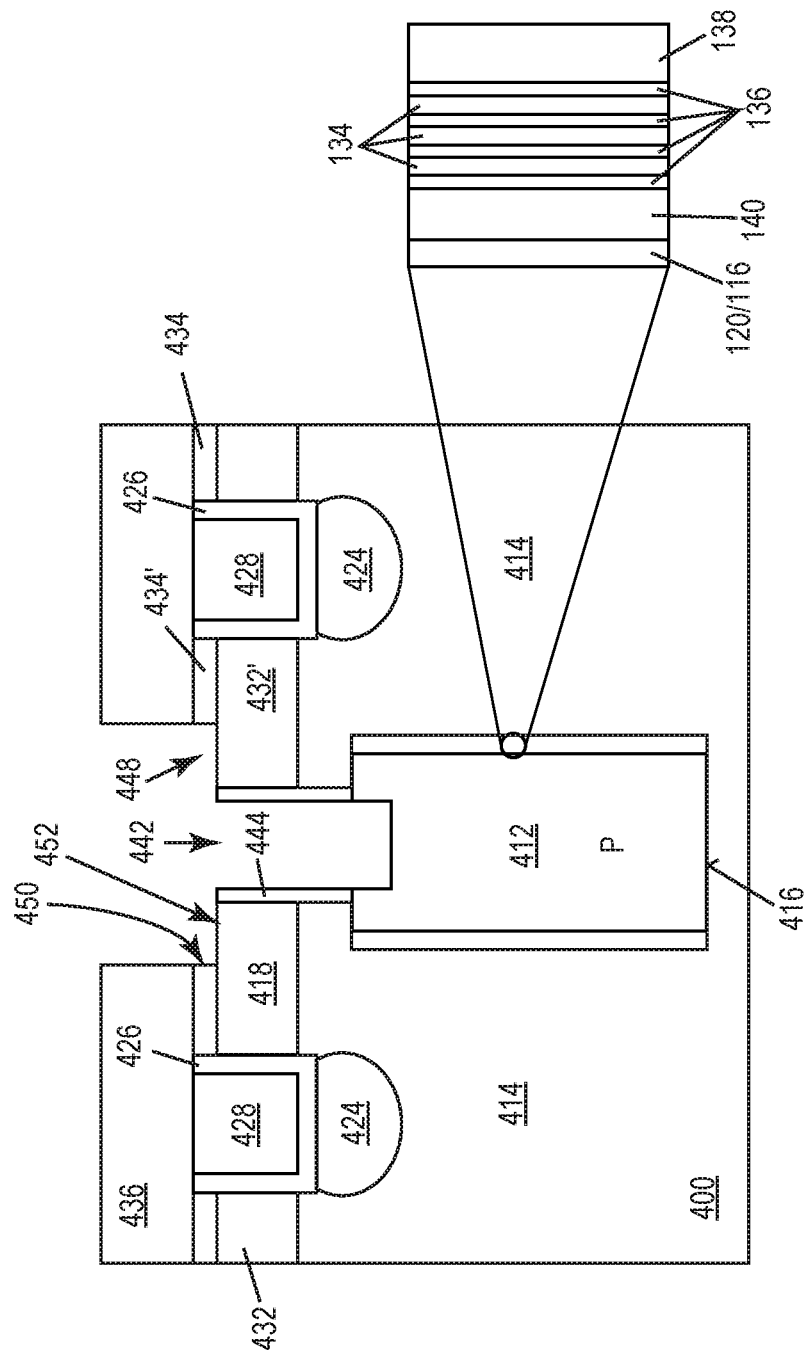

SEMICONDUCTOR DEVICE WITH SUPERJUNCTION AND OXYGEN INSERTED SI-LAYERS

BACKGROUND

Superjunction power MOSFETs (metal-oxide-semiconductor field effect transistors) have alternating regions of p-type pillars and n-type pillars. Because the impurity concentration of the n-type pillar regions can be increased, the conduction loss figure of merit (FOM) given by Rdson*A can be reduced, where Rdson is the drain-source on resistance of the device and A is device area. Since the conduction loss FOM can be reduced, the active area of the device can be made smaller for the same on-resistance, thereby enabling the switching loss FOM given by Rdson*$Q_{GD}$ to be reduced as well, where $Q_{GD}$ is gate-drain charge.

However, out diffusion of the p-type dopant species from the p-type pillars defines the pitch of the device, and therefore the conduction loss FOM. The out diffusion of the p-type dopant species from the p-type pillars also defines the thickness and number of epitaxial foundation layers used to form the superjunction structure and therefore cost. In the case of multiple epitaxial foundation layers used to form a superjunction structure, the n-type and p-type dopants are typically introduced simultaneously and during out diffusion, the fast-diffusing dopants define one doping zone. In the other doping zone, the fast-diffusing dopants act as background doping and therefore reduce carrier mobility.

Hence, better control of dopant out-diffusion in the superjunction region of a power semiconductor device is desirable.

SUMMARY

According to an embodiment of a semiconductor device, the semiconductor device comprises: a source region and a drain region of a first conductivity type; a body region of a second conductivity type between the source region and the drain region; a gate configured to control current through a channel of the body region; a drift zone of the first conductivity type between the body region and the drain region; a superjunction structure formed by a plurality of regions of the second conductivity type laterally spaced apart from one another by intervening regions of the drift zone; and a diffusion barrier structure disposed along sidewalls of the regions of the second conductivity type of the superjunction structure, the diffusion barrier structure comprising alternating layers of Si and oxygen-doped Si and a Si capping layer on the alternating layers of Si and oxygen-doped Si.

The diffusion barrier structure may also be disposed along a bottom face of the regions of the second conductivity type.

Separately or in combination, the drift zone may contact a bottom face of the regions of the second conductivity type.

Separately or in combination, the drain region may be formed in a Si substrate, the drift zone may be disposed in a first Si epitaxial layer formed over the Si substrate, and the source region and the body region may be disposed in a second Si epitaxial layer formed over the first Si epitaxial layer.

Separately or in combination, the gate may be a trench gate formed in the second Si epitaxial layer or a planar gate formed on a surface of the second Si epitaxial layer facing away from the first Si epitaxial layer.

Separately or in combination, the semiconductor device may further comprise a contact in electrical contact with the source region and the body region in the second Si epitaxial layer.

Separately or in combination, the contact may vertically extend through the second Si epitaxial layer, into the first Si epitaxial layer and electrically contacts a region of the plurality of regions of the second conductivity type, and sidewalls of the contact may be laterally separated from the second Si epitaxial layer and the first Si epitaxial layer by an insulating material.

Separately or in combination, the second Si epitaxial layer may contact a top face of the regions of the second conductivity type.

According to an embodiment of a method of manufacturing a semiconductor device, the method comprises: forming a source region and a drain region of a first conductivity type; forming a body region of a second conductivity type, wherein the body region is disposed between the source region and the drain region; forming a gate configured to control current through a channel of the body region; forming a drift zone of the first conductivity type, wherein the drift zone is disposed between the body region and the drain region; forming a plurality of regions of the second conductivity type laterally spaced apart from one another by intervening regions of the drift zone, to form a superjunction structure; and forming a diffusion barrier structure along sidewalls of the regions of the second conductivity type of the superjunction structure, the diffusion barrier structure comprising alternating layers of Si and oxygen-doped Si and a Si capping layer on the alternating layers of Si and oxygen-doped Si.

Forming the plurality of regions of the second conductivity type and forming the diffusion barrier structure along sidewalls of the regions of the second conductivity type may comprise: etching a plurality of trenches in a first Si epitaxial layer of the first conductivity type, wherein the first Si epitaxial layer includes the drift zone; epitaxially growing the alternating layers of Si and oxygen-doped Si on sidewalls and a bottom of the trenches; epitaxially growing the Si capping layer on the alternating layers of Si and oxygen-doped Si; and after forming the diffusion barrier structure, filling the trenches with epitaxial Si of the second conductivity type.

Separately or in combination, forming the source region and the body region may comprise: after filling the trenches with the epitaxial Si of the second conductivity type, forming a second Si epitaxial layer over the first Si epitaxial layer; implanting dopant species of the first conductivity type into a first part of the second Si epitaxial layer which corresponds to the source region; implanting dopant species of the second conductivity type into a second part of the second Si epitaxial layer which corresponds to the body region; and annealing the second Si epitaxial layer to activate the implanted dopant species of the first conductivity type to form the source region and to activate the implanted dopant species of the second conductivity type to form the body region.

Separately or in combination, the drain region may be disposed in a Si substrate over which the first Si epitaxial layer is formed.

Separately or in combination, the second Si epitaxial layer may be annealed in a temperature range above 1000° C. for 30 minutes or less.

Separately or in combination, the method may further comprise planarizing the epitaxial Si of the second conductivity type before forming the second Si epitaxial layer.

Separately or in combination, the method may further comprise: etching a contact trench into the second Si epitaxial layer, the contact trench exposing a sidewall of the source region and a top surface of the body region; and filling the contact trench with an electrically conductive material which contacts the sidewall of the source region and the top surface of the body region.

Separately or in combination, etching the contact trench may further comprise: etching the contact trench into the first Si epitaxial layer to expose a sidewall of the first Si epitaxial layer; depositing an insulating material on the sidewall of the body region and the sidewall of the first Si epitaxial layer; and etching the contact trench into a region of the plurality of regions of the second conductivity type, wherein the electrically conductive material may be in contact with the region of the second conductivity type into which the contact trench is etched, wherein sidewalls of the electrically conductive material may be laterally separated from the second Si epitaxial layer and the first Si epitaxial layer by the insulating material.

Separately or in combination, the method may further comprise removing the alternating layers of Si and oxygen-doped Si and the Si capping layer from the bottom of the plurality of trenches before filling the plurality of trenches with the epitaxial Si of the second conductivity type, so that the bottom of the plurality of trenches is uncovered when the plurality of trenches is filled with the epitaxial Si of the second conductivity type.

Separately or in combination, filling the plurality of trenches with the epitaxial Si of the second conductivity type may comprise: selectively growing in situ doped epitaxial Si of the second conductivity type in the plurality of trenches; and planarizing the in situ doped epitaxial Si of the second conductivity type before forming the second Si epitaxial layer.

Separately or in combination, filling the plurality of trenches with the epitaxial Si of the second conductivity type may comprise: selectively growing epitaxial Si in the plurality of trenches; planarizing the epitaxial Si; implanting dopant species of the second conductivity type into the planarized epitaxial Si; and annealing the first Si epitaxial layer to activate the implanted dopant species of the second conductivity type.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description which follows.

FIGS. 3A through 3E illustrate respective cross-sectional views of a semiconductor device having a superjunction structure and a diffusion barrier structure, during different stages of an embodiment of a manufacturing process.

DETAILED DESCRIPTION

Embodiments described herein provide a diffusion barrier structure between p-type and n-type pillars of a superjunction structure of a semiconductor device. The diffusion barrier structure controls dopant interdiffusion from both lateral (side) directions in the superjunction region of the device, thereby improving superjunction device performance e.g. by reducing cell pitch. The cell pitch may be a center-to-center distance of neighboring cells or an edge-to-edge distance. In each case, the diffusion barrier structure described herein provides tighter dopant distribution control in the superjunction region of a semiconductor device. As a result, the conduction loss FOM given by Rdson*A may be reduced by about 20% or more by cutting in half the amount of n-type and p-type dopant interdiffusion in the superjunction region of a small pitch device, allowing superjunction-based transistors to be used in low voltage ranges e.g. as low as 10V. The diffusion barrier structure teachings described herein are also well-suited for high voltage applications, e.g., up to 1000V or even higher. Described next in more detail are embodiments of semiconductor devices with such a diffusion barrier structure, and corresponding methods of manufacture.

Figure 1:
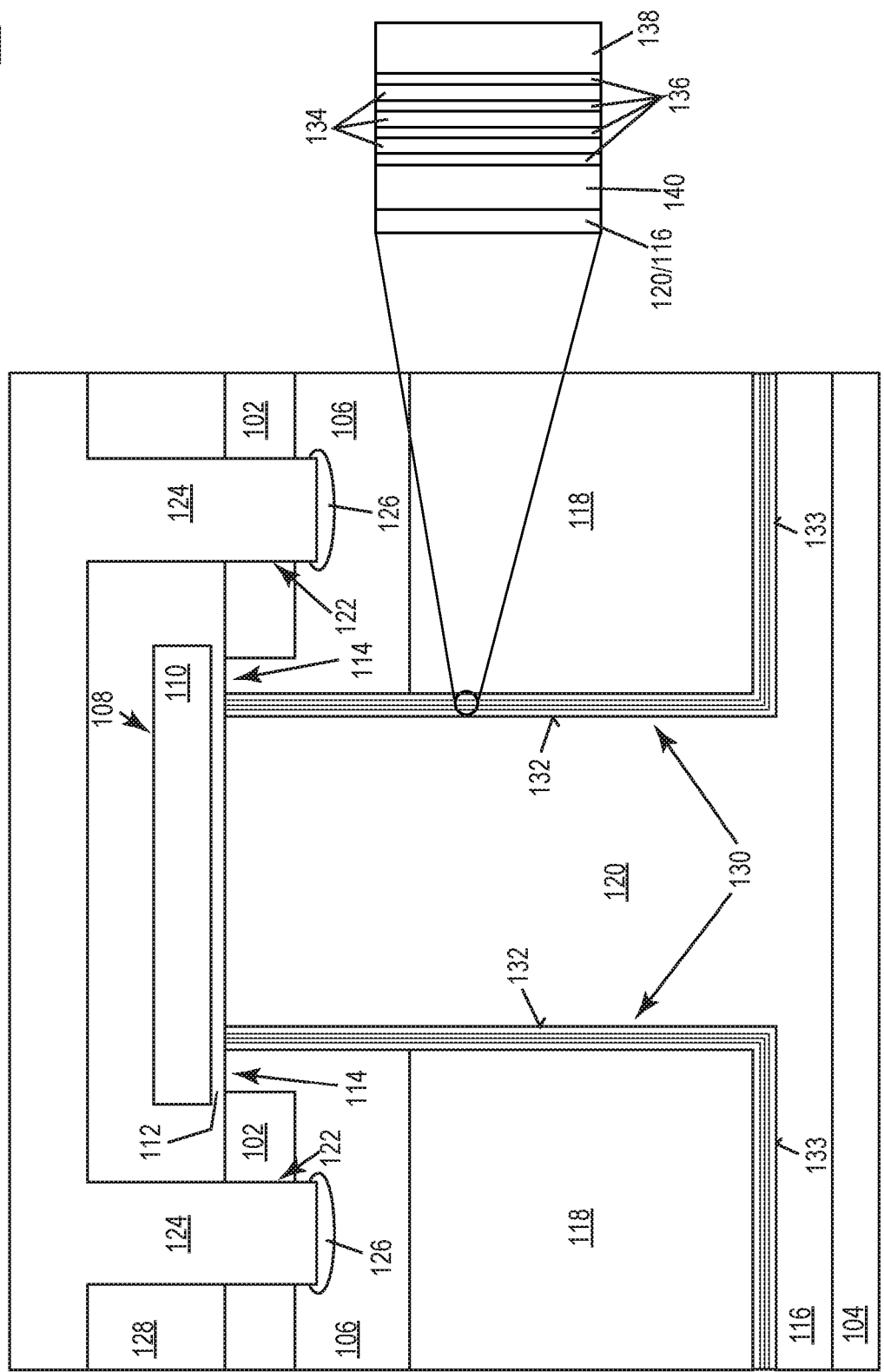
FIG. 1 illustrates a partial cross-sectional view of an embodiment of one cell of a semiconductor device having a superjunction structure and a diffusion barrier structure.

FIG. 1 illustrates a partial cross-sectional view of an embodiment of one cell of a semiconductor device 100 having a superjunction structure. The semiconductor device 100 may include a plurality of such cells, each cell having the same or similar construction. The semiconductor device 100 may be a power semiconductor device such as a power MOSFET, an IGBT (insulated gate bipolar transistor), etc. The semiconductor device includes a source region 102 and a drain region 104 of a first conductivity type, a body region 106 of a second conductivity type opposite the first conductivity type between the source region 102 and the drain region 104, a planar gate 108 which includes a gate electrode 110 separated from the underlying semiconductor material by a gate dielectric 112 and configured to control current through a channel 114 of the body region 106, and a drift zone 116 of the first conductivity type between the body region 106 and the drain region 104. The channel region 114 laterally extends along the bottom of the planar gate 108. The device current has a lateral component in the channel region 114 along the planar gate lateral extension, and a vertical component along the drift zone vertical extension.

Depending on the type of device, additional structures may be formed in the drift zone 116 and/or between the drift zone 116 and the drain region 104. For example, a field stop layer (not shown) may be formed between the drift zone 116 and the drain region 104 in the case of an IGBT type device. In general, any type of semiconductor device with a superjunction structure may utilize the diffusion barrier teachings described herein.

In the case of an n-channel device, the source region 102, drain region 104 and drift zone 116 are doped n-type and the body region 106 and channel region 114 are doped p-type. Conversely in the case of an p-channel device, the source region 102, drain region 104 and drift zone 116 are doped p-type and the body region 106 and channel region 114 are doped n-type. In either case, the superjunction structure is formed by a plurality of regions 118 of the second conductivity type laterally spaced apart from one another by intervening regions 120 of the drift zone 116. The regions 118 of the second conductivity type may have a columnar (vertically elongated) shape, a stripe (laterally elongated) shape, or another type of shape depending on the type of cell construction. Two such regions 118 of the second conductivity type and one intervening region 120 of the drift zone 116 are shown in the partial cross-sectional view of the semiconductor device 100 in FIG. 1.

In one embodiment, the drain region 104 of the semiconductor device 100 is a highly doped region of a semiconductor substrate such as a Si substrate and the drift zone 116 and the regions 118 of the second conductivity type are part of a first epitaxial layer formed over the semiconductor substrate. Further according to this embodiment, the source region 102 and the body region 106 of the semiconductor device 100 are disposed in a second epitaxial layer formed over the first epitaxial layer.

The semiconductor device 100 may also include a contact trench 122 which extends through the source region 102 and into the body region 106. The contact trench 122 is filled with an electrically conductive material 124 such as doped polysilicon, metal, etc. which contacts the source region 102 at the sidewall of the contact trench 122 and a highly doped body contact region 126 at the bottom of the contact trench 122. The highly doped body contact region 126 has the same doping type as the body region 106, but at a higher concentration to provide good ohmic contact with the electrically conductive material 124 which fills the contact trench 122. The planar gate 108 is separated from the overlying electrically conductive material 124 by an interlayer dielectric 128.

The semiconductor device 100 further includes a diffusion barrier structure 130 disposed along at least sidewalls 132 of the regions 118 of the second conductivity type of the superjunction structure. According to the embodiment illustrated in FIG. 1, the diffusion barrier structure 130 is also disposed along the bottom face 133 of the regions 118 of the second conductivity type. The diffusion barrier structure 130 comprises alternating layers of Si 134 and oxygen-doped Si 136 and a Si capping layer 138 on the alternating layers of Si 134 and oxygen-doped Si 136. The oxygen-doped Si layers 136 have a very high oxygen dopant concentration within respective monolayers 136, each of which adjoins a Si layer 134 which may be of a different thickness than the adjoining oxygen-doped Si layer 136.

The alternating layers of Si 134 and oxygen-doped Si form 136 an oxygen-doped silicon region grown by epitaxy. In an embodiment, the oxygen concentration for each oxygen-doped Si layer 136 is below 5e14 cm−3. Each oxygen-doped Si layer 136 may have a thickness in the atomic range (e.g. one or several atoms thick) or in the nanometer (nm) range to ensure sufficient crystal information for growing Si 134 on the oxygen-doped Si layers 136. The alternating layers of Si 134 and oxygen-doped Si 136 may be realized by epitaxially growing Si layers 134 alternating with oxygen layers 136 respectively adsorbed on surfaces of the Si layers 134, e.g., with a particular limited thickness for the oxygen-doped Si layers 136 to ensure adequate Si growth.

FIG. 1 provides an exploded view of the diffusion barrier structure 130, which may also include a Si buffer layer 140 below the alternating layers of Si 134 and oxygen-doped Si 136. The Si buffer layer 140 may be relatively thin, e.g., in the range of 2-5 nm thick. The Si buffer layer 140 may be grown after an implant or an etch step. The capping layer 138 provides high carrier mobility in this region of the device 100. Part of the channel region 114 may be formed in the part of the Si capping layer 138 which laterally extends along the planar gate 108. The buffer layer 140 may be omitted.

The oxygen-doped Si layers 136 of the diffusion barrier structure 130 limit lateral out-diffusion of dopant atoms from the regions 118 of the second conductivity type of the superjunction structure into the intervening regions 120 of the drift zone 116, and are especially effective at limiting interstitial-driven diffusion as the oxygen acts as an interstitial stop. Hence, the lateral dimension of the regions 118 of the second conductivity type may be well controlled, allowing for a smaller cell pitch. In a plane parallel to the oxygen-doped Si layers 136 of the diffusion barrier structure 130, the dopants diffuse as usual. In a plane perpendicular to the oxygen-doped Si layers 136 of the diffusion barrier structure 130, dopant interdiffusion is slowed down by the diffusion barrier structure 130. The oxygen-doped Si layers 136 of the diffusion barrier structure 130 may also improve carrier mobility within the channel region 114 of the device 100.

The oxygen-doped Si layers 136 of the diffusion barrier structure 130 may be formed by introducing oxygen partial monolayers to a Si lattice. The oxygen atoms are interstitially placed to minimize disruption to the Si lattice. Layers 134 of Si atoms separate adjacent oxygen partial monolayers 136. The alternating layers of Si 134 and oxygen-doped Si 136 may be formed by Si epitaxy with absorption of oxygen at different steps. For example, temperature and gaseous conditions can be controlled during the epitaxy process to form the partial oxygen monolayers 136. Oxygen may be introduced/incorporated between epitaxial layers of Si 134, e.g. by controlling the introduction of an oxygen precursor into the epitaxy chamber. The resulting barrier barrier structure 130 includes monolayers 136 that comprise mainly Si but have a doped level or concentration level of oxygen alternating with standard epitaxial layers 134 of Si without oxygen. The diffusion barrier structure 130 also comprises a capping layer 138 of Si epitaxially grown on the alternating layers of Si 134 and oxygen-doped Si 136, or the capping layer 138 of Si may be omitted.

Figure 2:
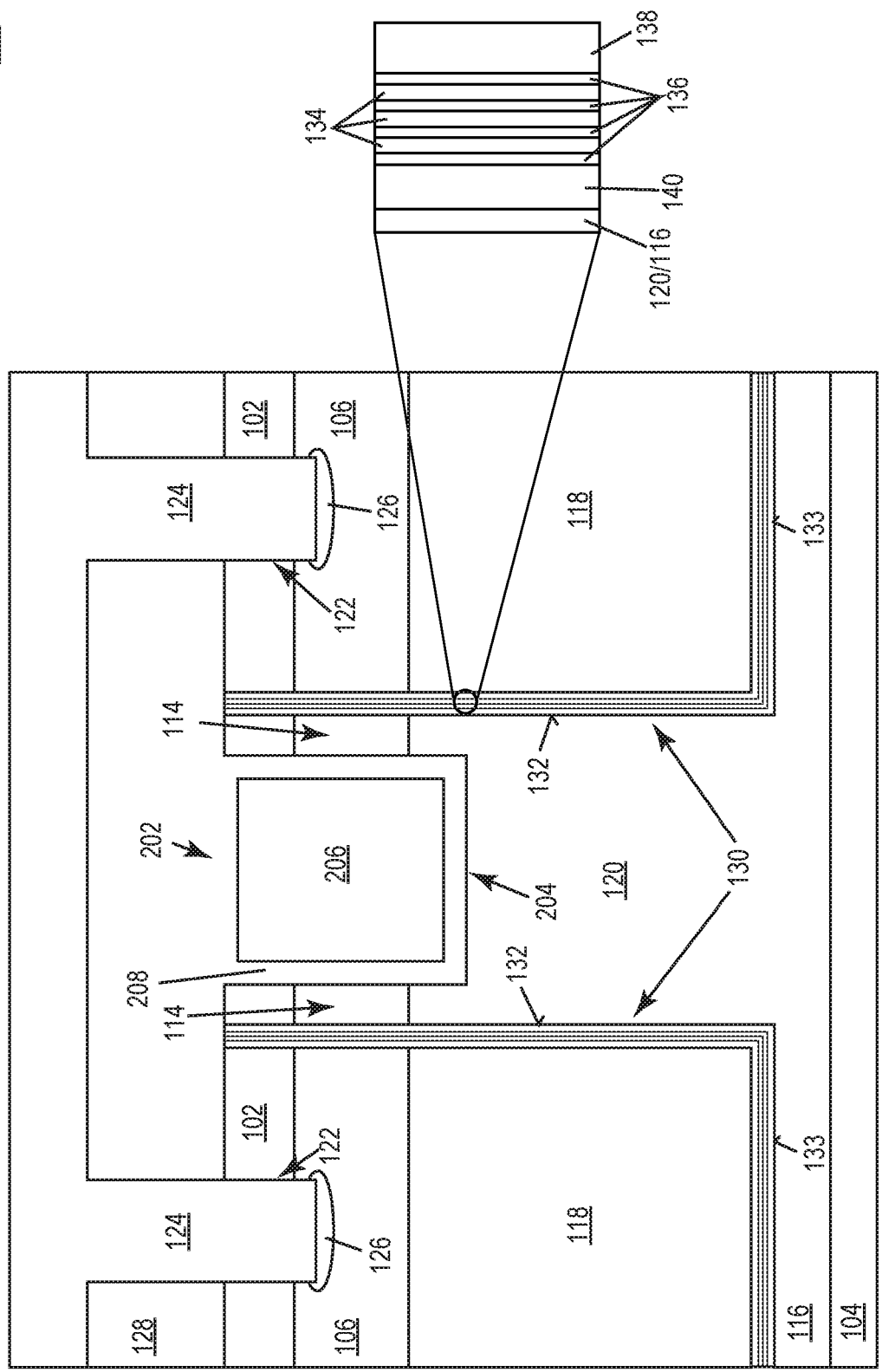
FIG. 2 illustrates a partial cross-sectional view of another embodiment of one cell of a semiconductor device having a superjunction structure and a diffusion barrier structure.

FIG. 2 illustrates a partial cross-sectional view of another embodiment of one cell of a semiconductor device 200 having a superjunction structure. The embodiment illustrated in FIG. 2 is similar to the embodiment illustrated in FIG. 1. Different, however, the semiconductor device 200 has a trench gate 202 instead of a planar gate. The trench gate 202 includes a gate trench 204 extending into the semiconductor material and a gate electrode 206 disposed in the gate trench 204. The gate electrode 206 is insulated from the surrounding semiconductor material by a gate dielectric 208. A field electrode (not shown) may be disposed in the gate trench 202 below the gate electrode 206, and insulated from the surrounding semiconductor material and the gate electrode 206 by a field dielectric (not shown). The field electrode instead may be disposed in a different trench than the gate electrode 206, or omitted altogether. In each case, the semiconductor device 200 also includes the diffusion barrier structure 130 disposed along at least sidewalls 132 of the regions 118 of the second conductivity type of the superjunction structure.

FIGS. 3A through 3E illustrate respective cross-sectional views of a semiconductor device having a superjunction structure and the diffusion barrier structure 130, during different stages of an embodiment of a manufacturing process.

FIG. 3A shows the semiconductor device after a semiconductor growth substrate 300 such as a Si substrate is provided and a first epitaxial layer 302 of the first conductivity type is epitaxially grown on the substrate 300. The growth substrate 300 may be heavily doped, e.g., to form a drain region of the device. The first epitaxial layer 302 may be doped in situ or ex situ, and forms the drift zone of the device.

Figure 3B:
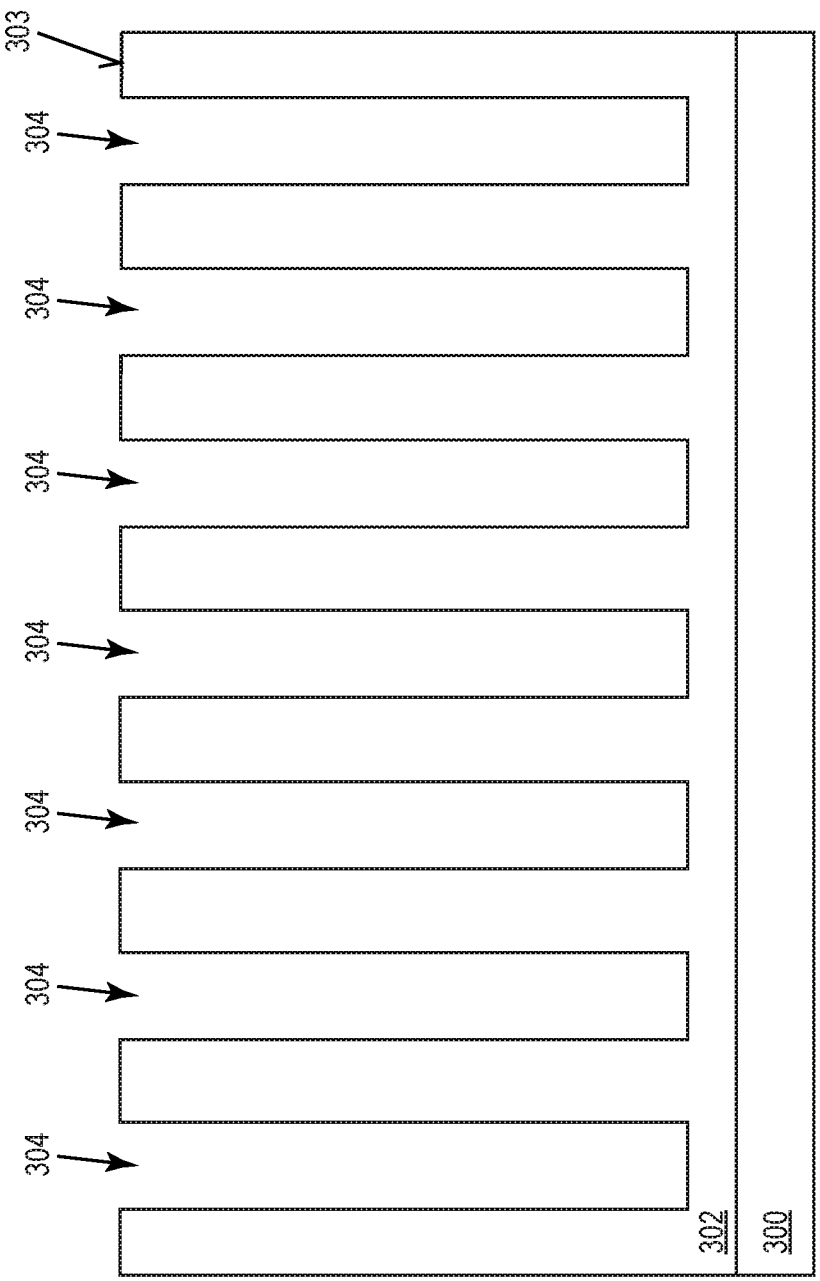

FIG. 3B shows the semiconductor device after trenches 304 are formed in the first epitaxial layer 302. The trenches 304 may be etched into the first epitaxial layer 302 using any typical trench formation process such as applying a mask/insulating material (not shown) on the front main surface 303 of the first epitaxial layer 302 and etching the trenches 304 into the first epitaxial layer 302 through respective openings in the mask.

Figure 3C:
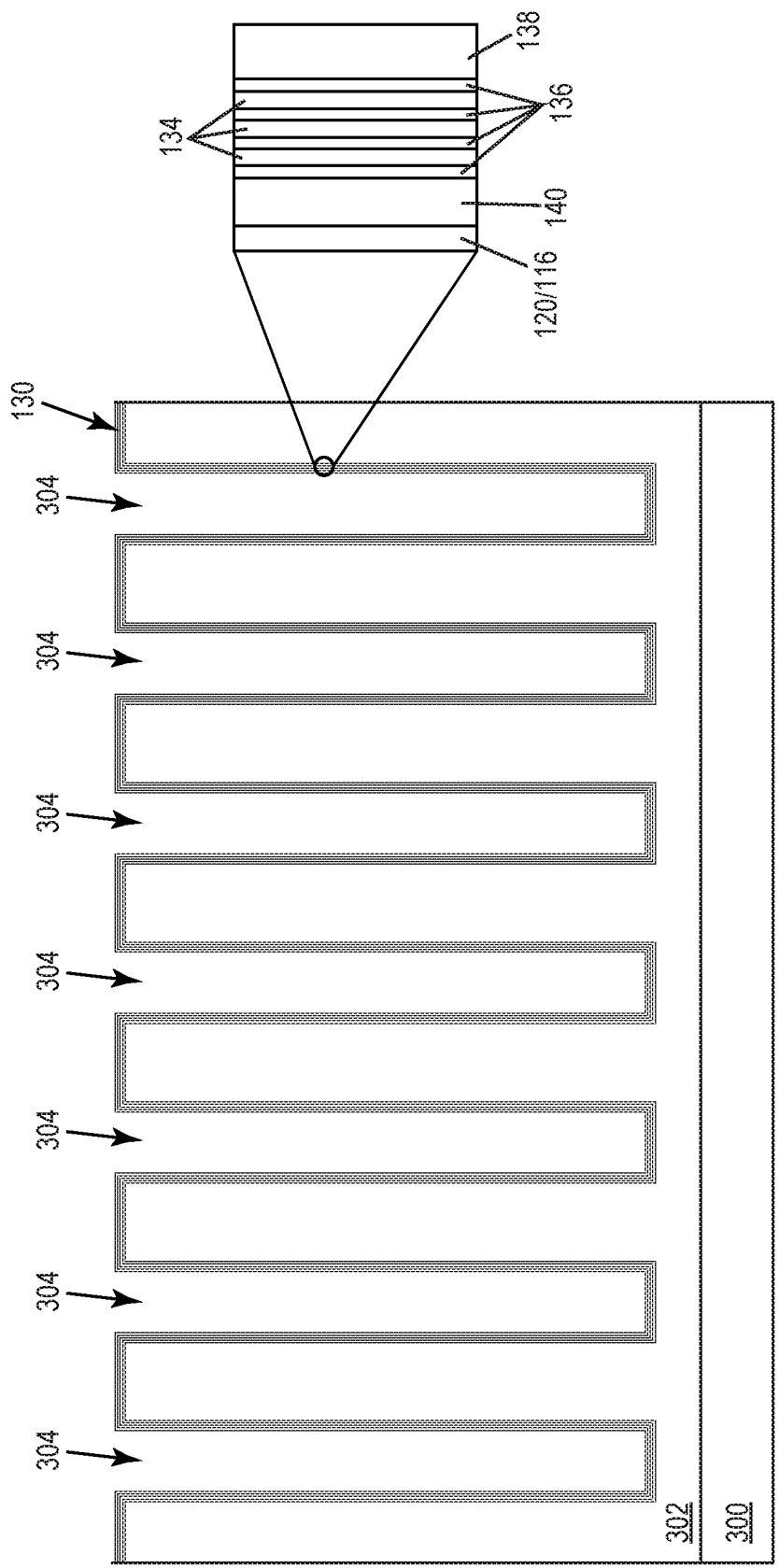

FIG. 3C shows the semiconductor device after the alternating layers of Si 134 and oxygen-doped Si 136 of the diffusion barrier structure 130 are epitaxially grown on the sidewalls and bottom of the trenches 304. According to this embodiment, the alternating layers of Si 134 and oxygen-doped Si 136 are epitaxially grown on the sidewalls and the bottom of the trenches 304 after etching the trenches 304 into the first epitaxial layer 302 but before forming the source and body regions of the device. The capping layer 138 of Si may have the same standard in situ doping concentration as the alternating layers of Si 134 and oxygen-doped Si 136 and may be doped later with a different dopant species and concentration. Alternatively, the capping layer 138 of Si may have a different in situ doping concentration compared to the alternating layers of Si 134 and oxygen-doped Si 136.

Figure 3D:
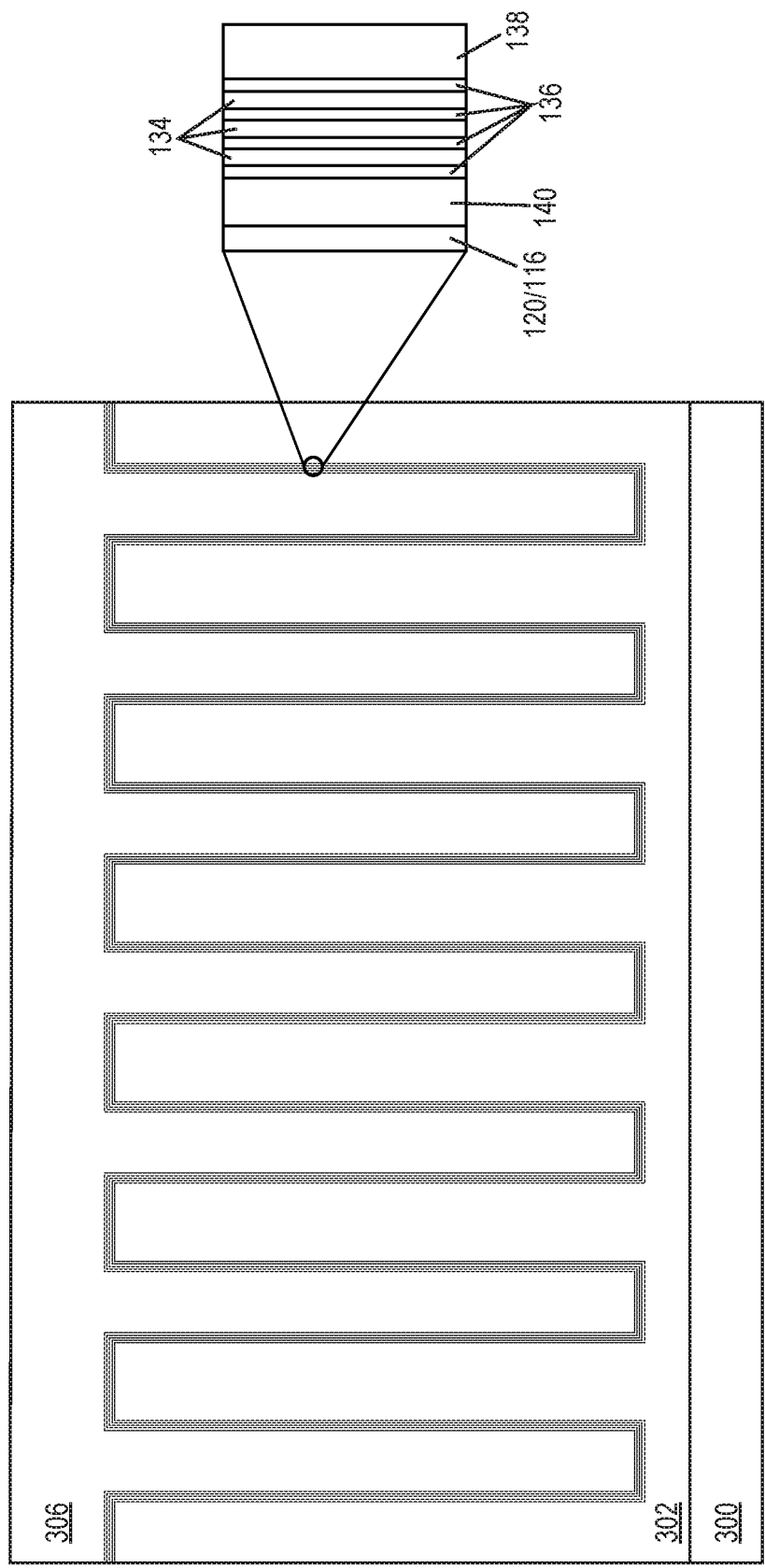

FIG. 3D shows the semiconductor device after the trenches 304 are filled with epitaxial Si 306 of the second conductivity type. The epitaxial Si 306 of the second conductivity type may be doped in situ or ex situ and may be planarized, e.g. by chemical-mechanical polishing (CMP).

Figure 3E:
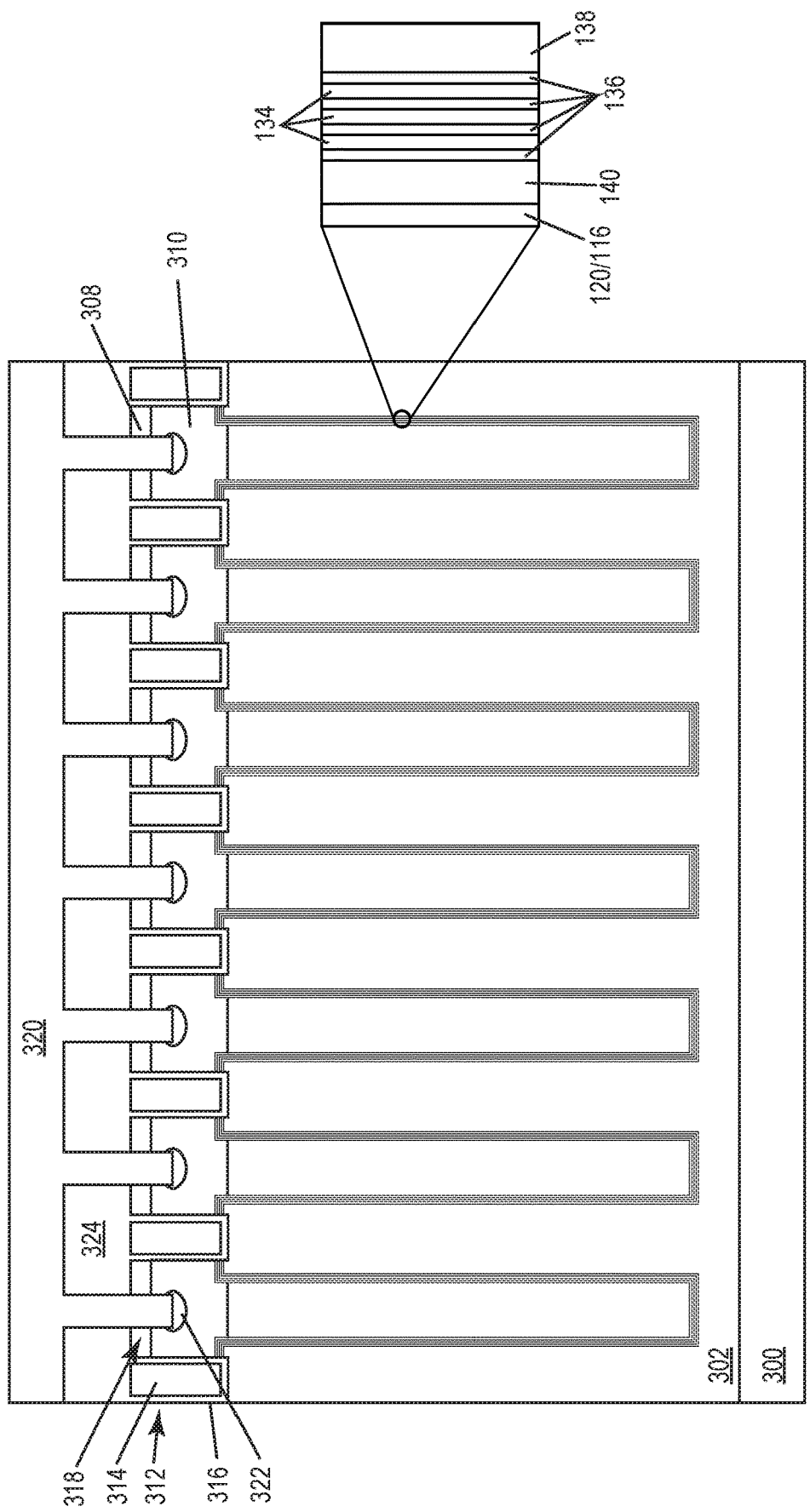

FIG. 3E shows the semiconductor device after dopant species of the first conductivity type are implanted into a first part of the epitaxial Si 306 of the second conductivity type or into a second Si epitaxial layer grown over the epitaxial Si 306, and after dopant species of the second conductivity type are implanted into a second (deeper) part of the epitaxial Si 306 or second epitaxial layer. The semiconductor device is annealed to activate the implanted dopant species of the first conductivity type to form source regions 308 of the device, and to activate the implanted dopant species of the second conductivity type to form body regions 310 of the device. In one embodiment, the annealing is done in a temperature range above 1000° C. for 30 minutes or less. In the case of growing a second epitaxial layer over the epitaxial Si 306 of the second conductivity type, the epitaxial Si 306 of the second conductivity type may be planarized e.g. by CMP before forming the second Si epitaxial layer.

Gate trenches 312 are also formed in the semiconductor material, and a gate electrode 314 is disposed in each gate trench 312. The gate electrodes 314 are insulated from the surrounding semiconductor material by a gate dielectric 316. Contact trenches 318 extend through the source regions 308 and into the body regions 310. The contact trenches 318 are filled with an electrically conductive material 320 such as doped polysilicon, metal, etc. which contacts the source regions 308 at the sidewall of the contact trenches 318 and a highly doped body contact region 322 at the bottom of the contact trenches 318. The highly doped body contact regions 322 have the same doping type as the body regions 310, but at a higher concentration to provide good ohmic contact with the electrically conductive material 320 which fills the contact trenches 318. An interlayer dielectric 324 is provided between the electrically conductive material 320 top surface of the semiconductor material.

Figure 4A:
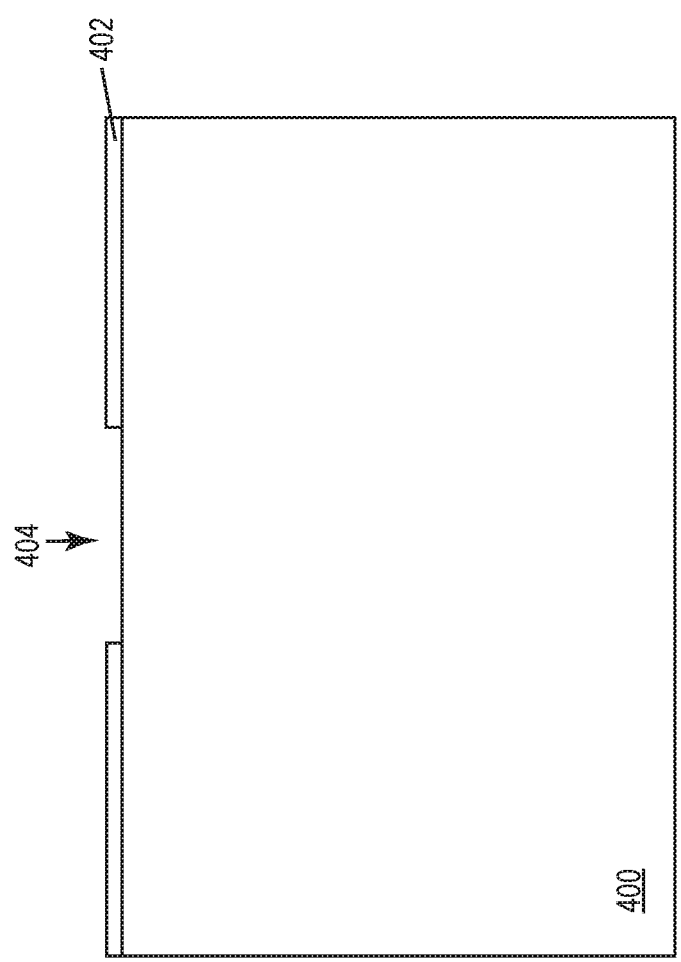
FIGS. 4A through 4O illustrate respective cross-sectional views of a semiconductor device having a superjunction structure and a diffusion barrier structure, during different stages of another embodiment of a manufacturing process.
Figure 4B:
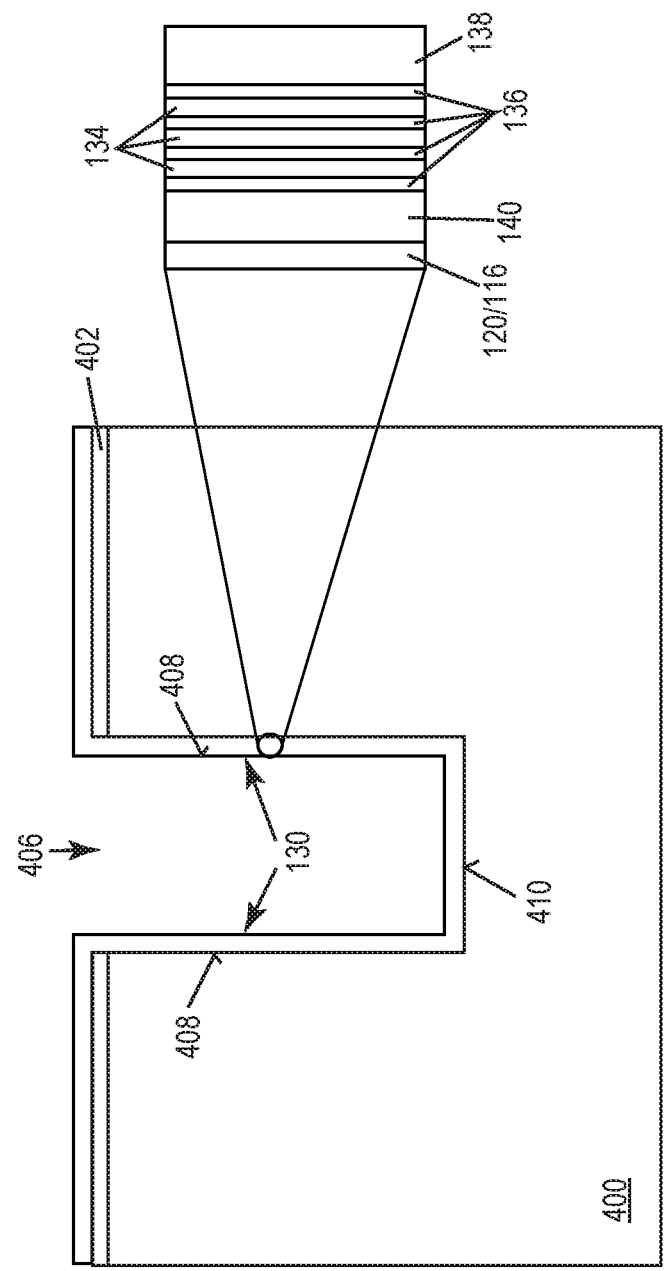
Figure 4E:
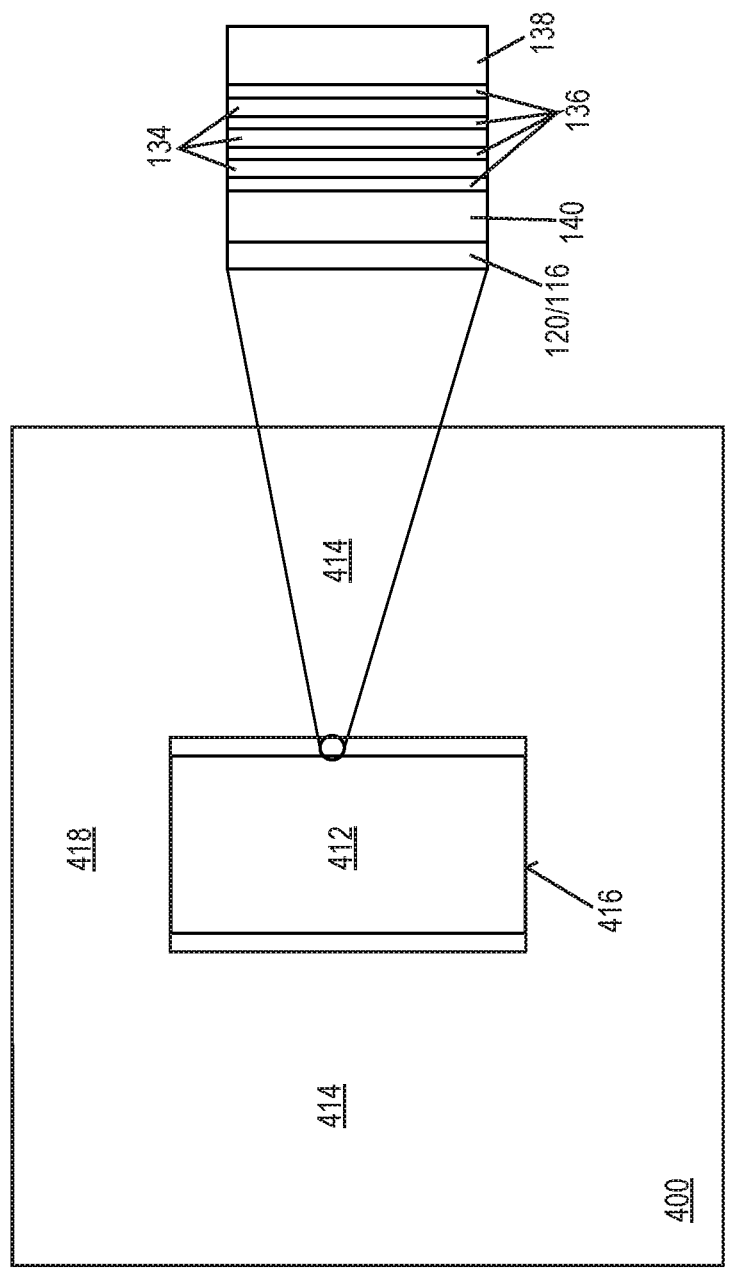
Figure 4F:
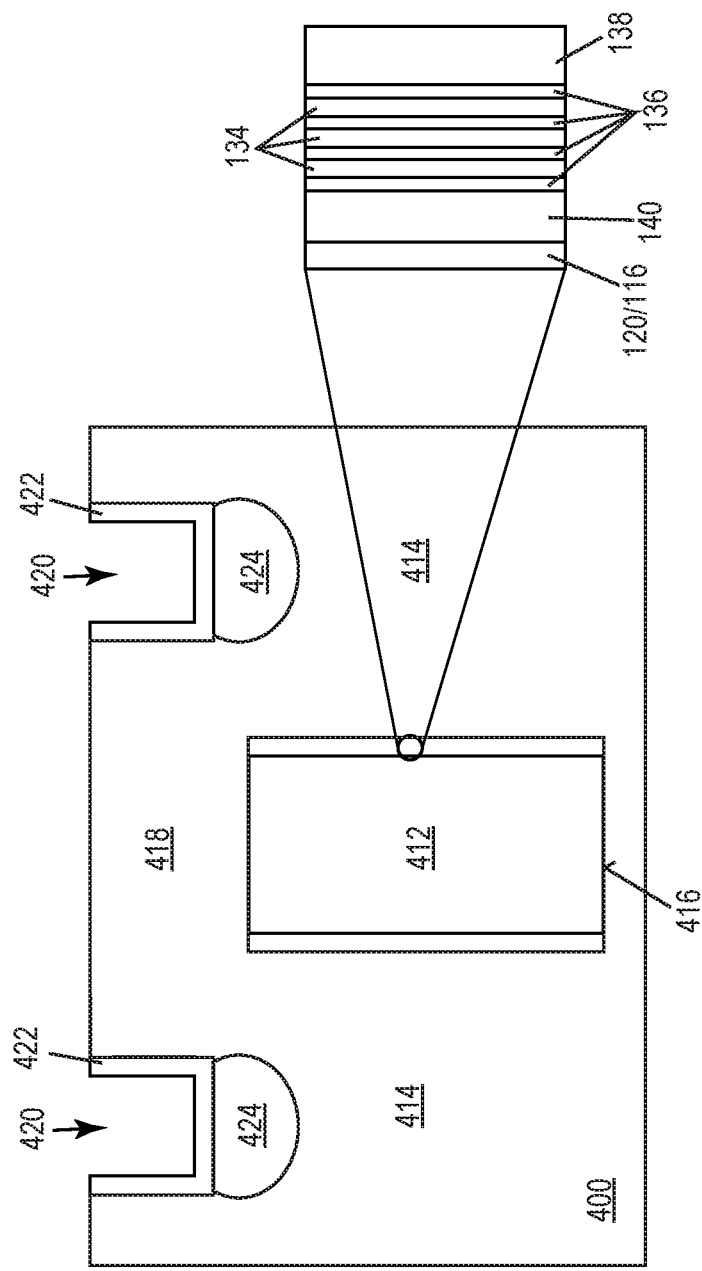
Figure 4G:
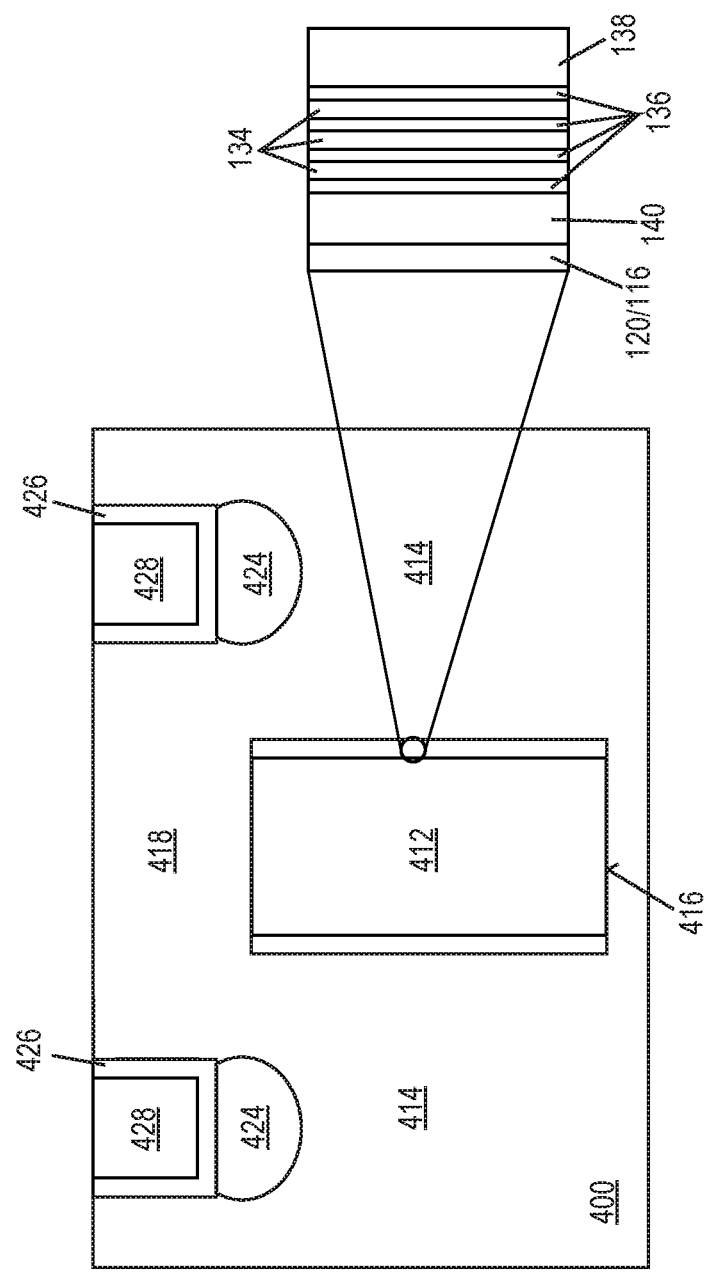
Figure 4H:
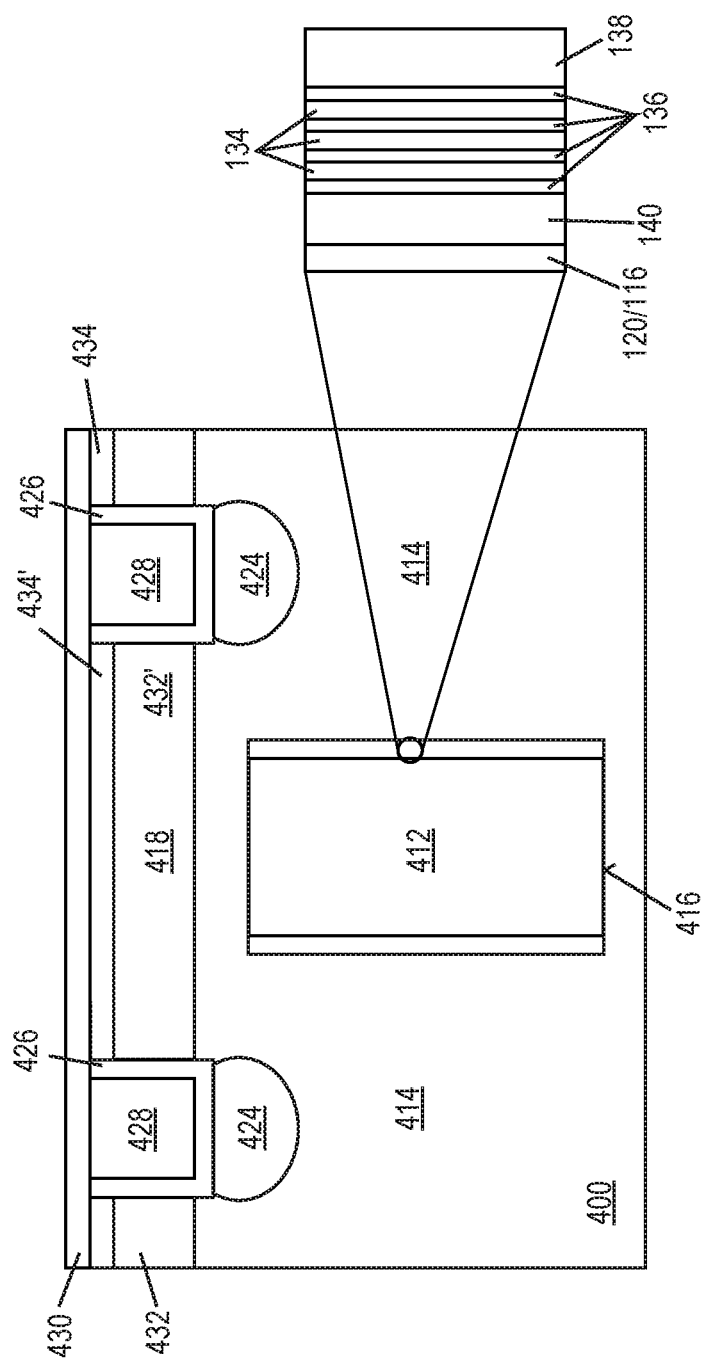
Figure 4I:
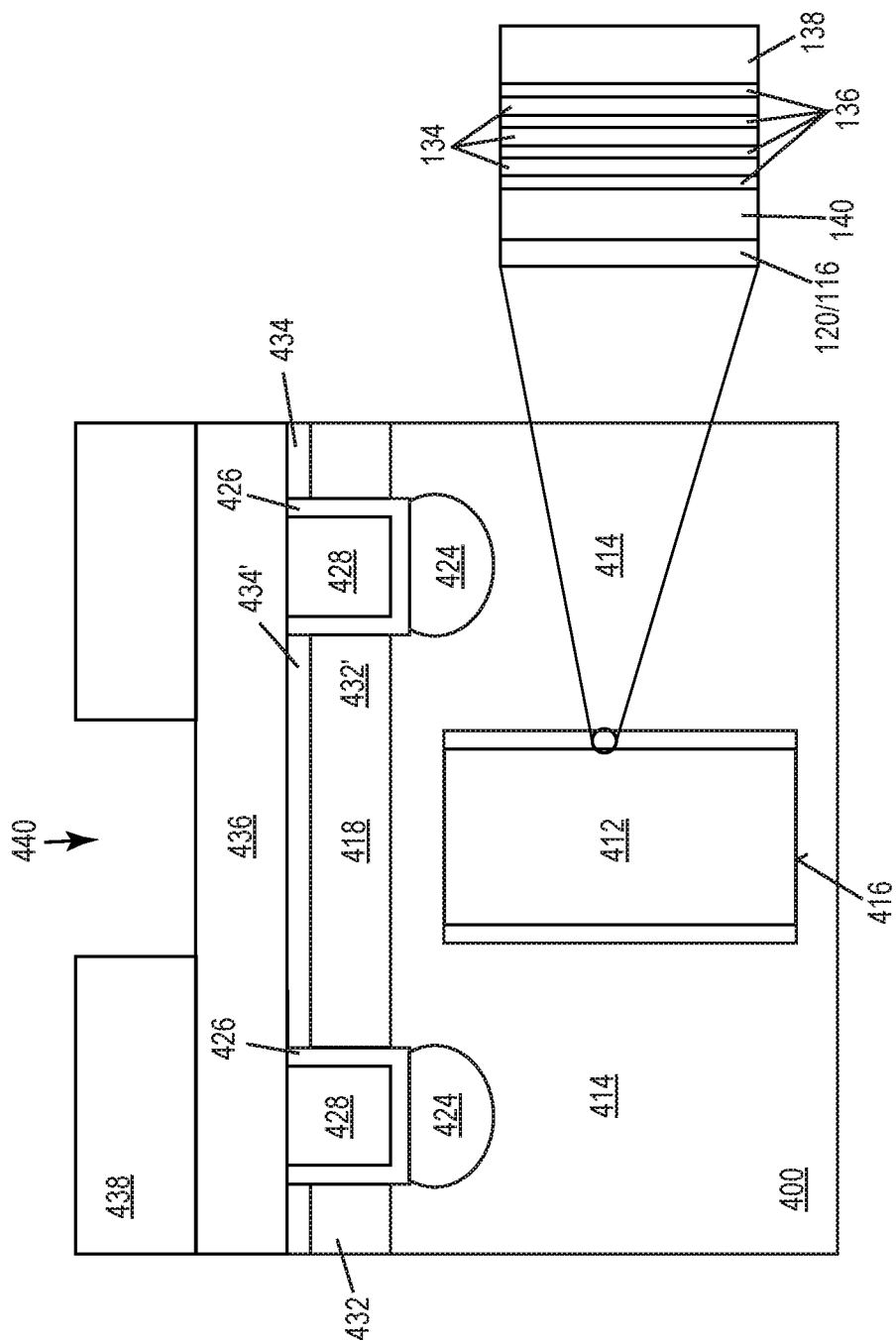
Figure 4J:
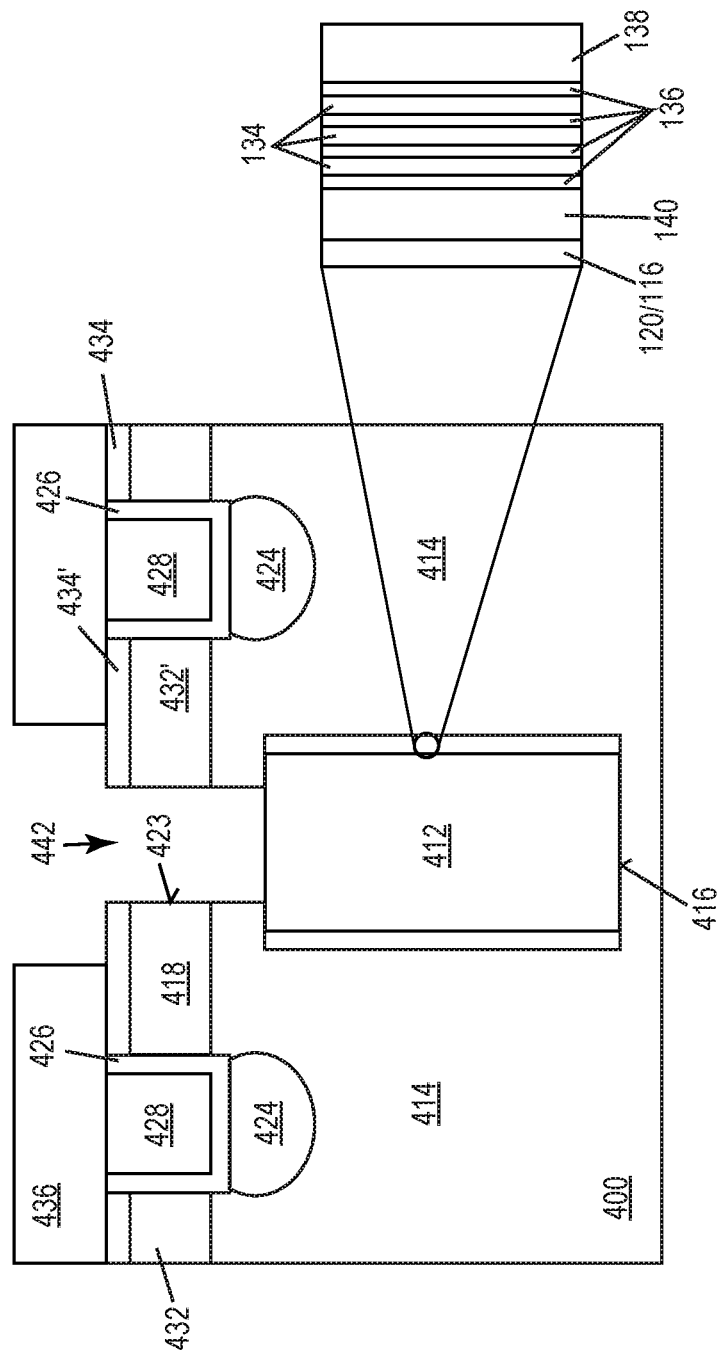
Figure 4K:
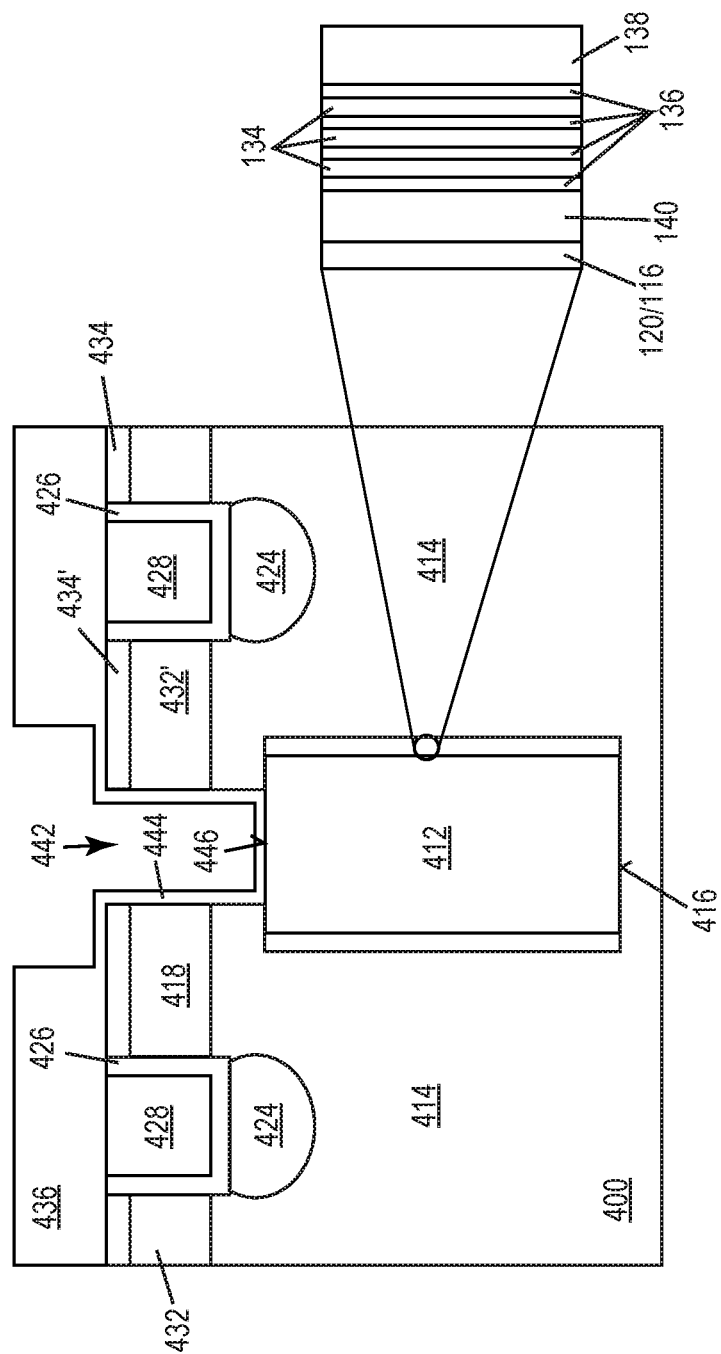
Figure 4L:
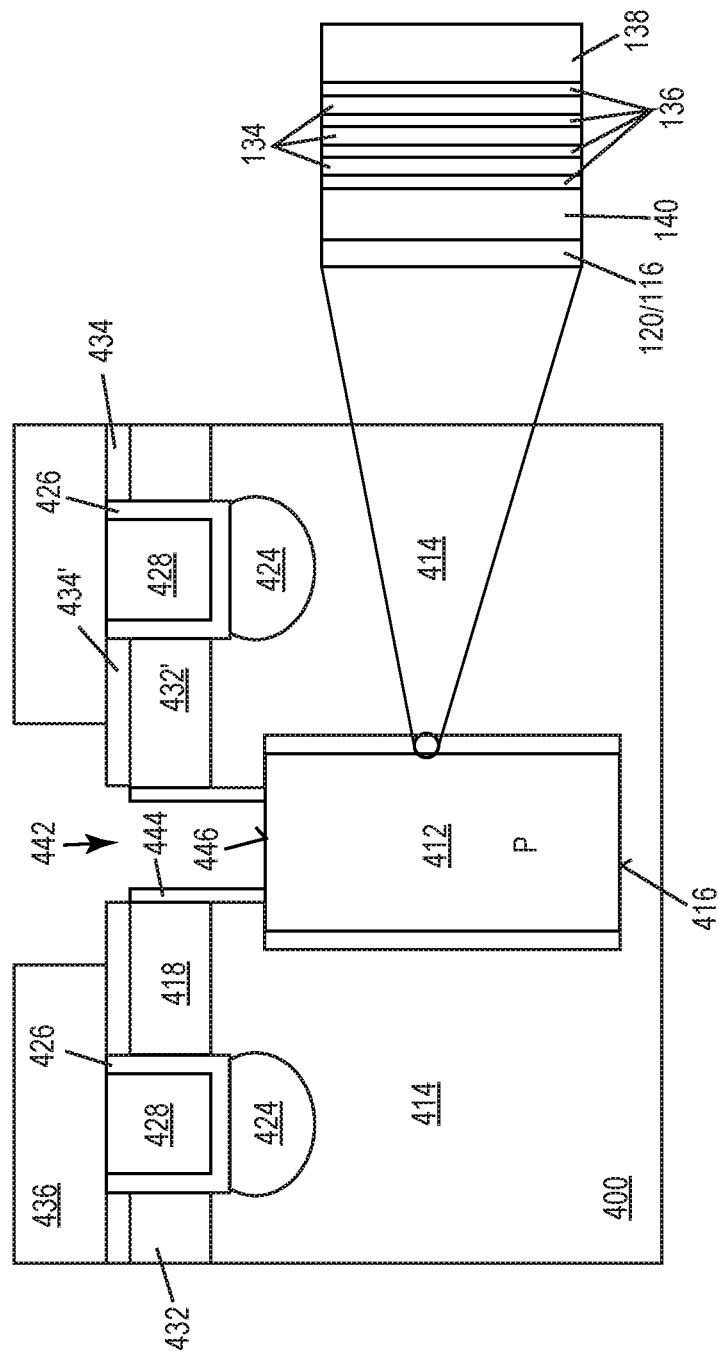
Figure 4N:
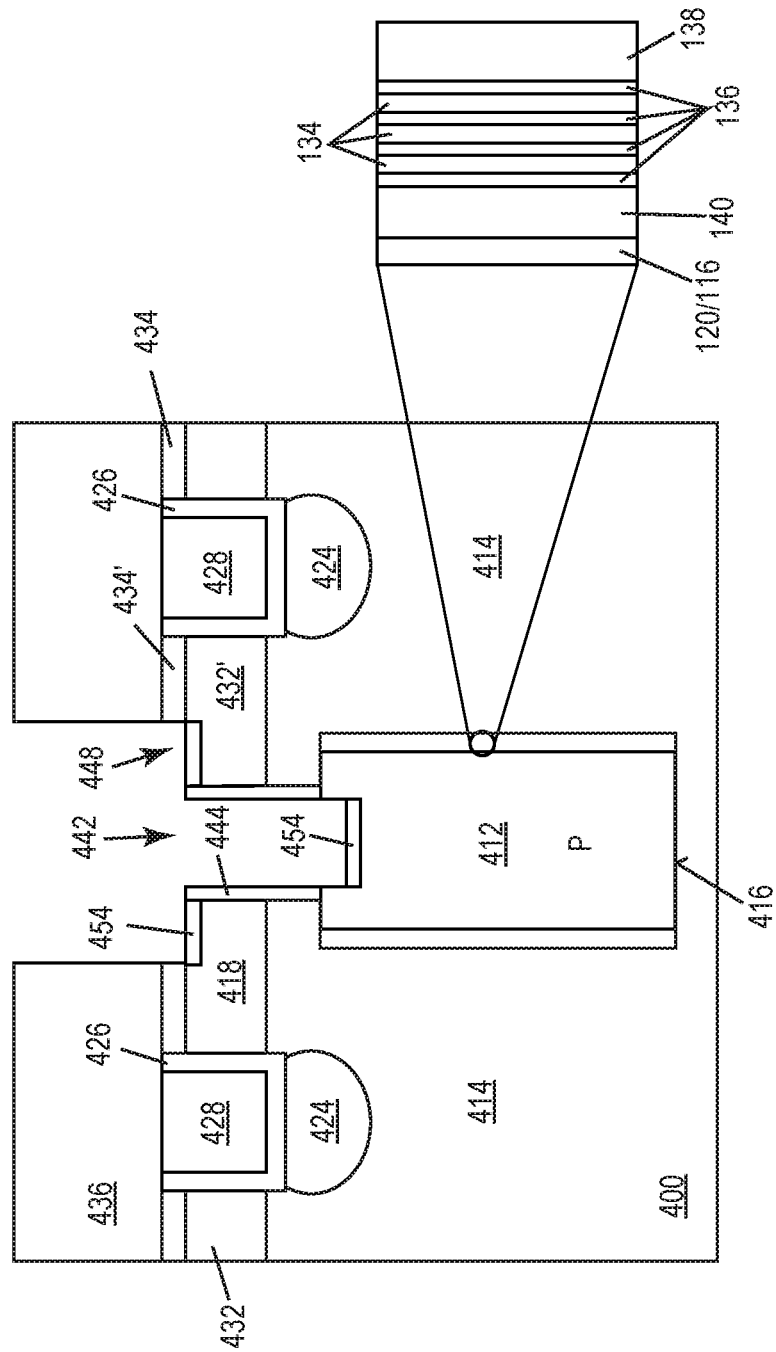
Figure 4O:
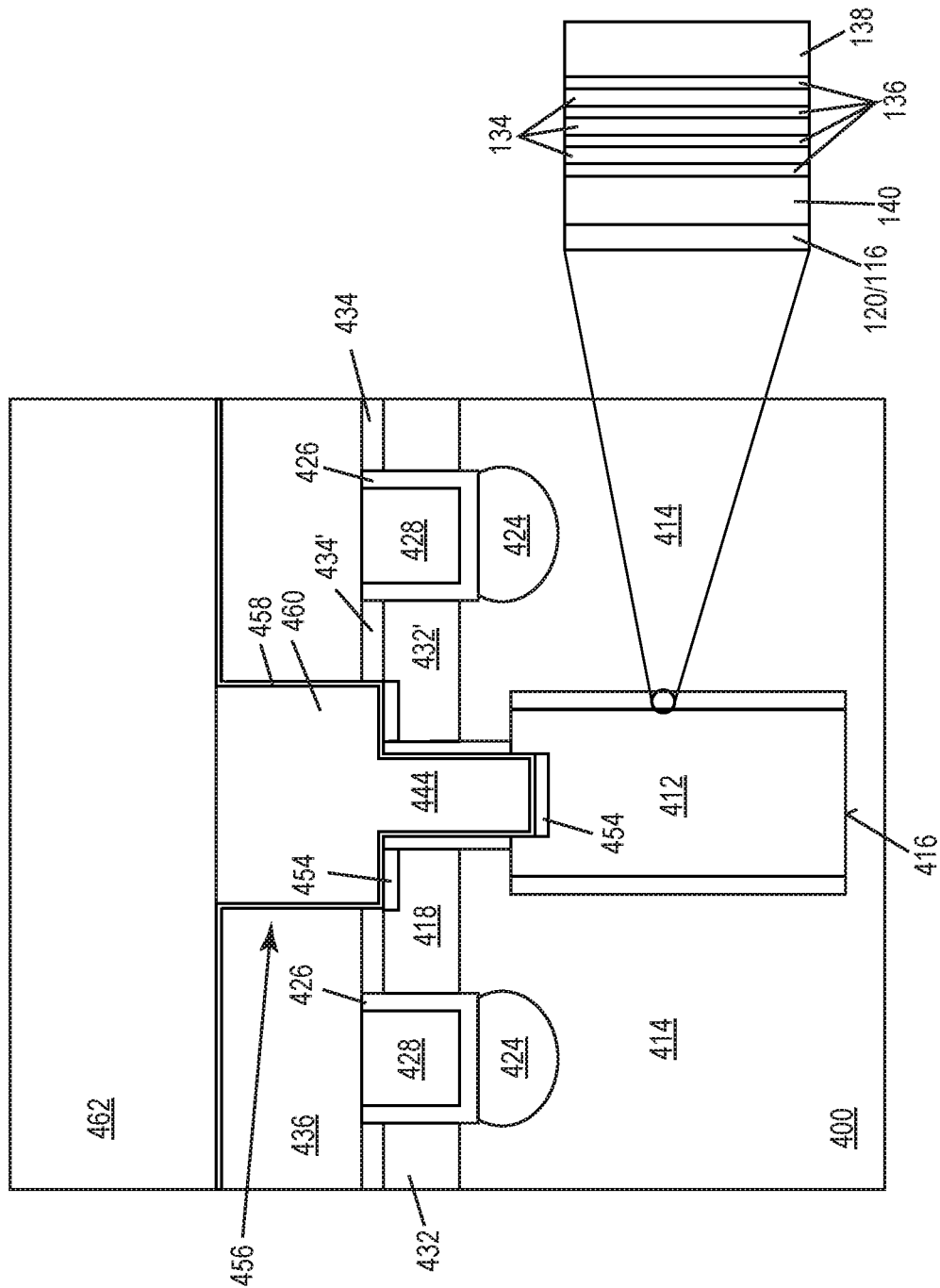

FIGS. 4A through 4O illustrate respective cross-sectional views of a semiconductor device having a superjunction structure and the diffusion barrier structure 130, during different stages of another embodiment of a manufacturing process. FIGS. 4A through 4O illustrate processing of the semiconductor device in one cell. The semiconductor device may include a plurality of such cells, each cell having the same or similar construction.

FIG. 4A shows the semiconductor device after a base semiconductor material 400 is provided and a hard mask 402 such as a silicon-based hard mask is formed on the base semiconductor material 400. The hard mask 402 has openings 404 which define the location of trenches to be etched into the base semiconductor material 400. The base semiconductor material 400 may be a growth substrate such as a Si substrate or a Si epitaxial layer grown over such a substrate.

FIG. 4B shows the semiconductor device after trenches 406 are etched into the base semiconductor material 400 and after the diffusion barrier structure 130 is formed along the sidewalls 408 and bottom 410 of the trenches 406. The diffusion barrier structure 130 may be formed as previously described herein.

FIG. 4C shows the semiconductor device after a spacer etch process which removes the diffusion barrier structure 130 from the bottom of the trenches 406. In this case, the base semiconductor material 400 may form the drift zone of the device and the drift zone may adjoin the bottom 410 of the trenches 406. Alternatively, the spacer etch process may be skipped so that the diffusion barrier structure 130 remains along the bottom of the trenches 406.

FIG. 4D shows the semiconductor device after selective epitaxial growth of semiconductor material 412 of the second conductivity type in the trenches 406 and on the top surface of the base semiconductor material 400. The semiconductor material 412 of the second conductivity type which fills the trenches 406 may be doped in situ or ex situ. In the case of ex situ doping, e.g. if more precise doping dose control is desired, selective epitaxial growth of Si in the trenches 406 is performed followed by planarization, hard mask removal, masked dopant implantation and dopant activation to define regions 412 of the second conductivity type in the trenches 406. In the case of in situ doping, selective epitaxial growth of doped (second conductivity type) Si in the trenches 406 is performed followed by planarization and hard mask removal.

In the case of in situ or ex situ doping, the semiconductor material 412 filling the trenches 406 is planarized, e.g. by CMP which stops on the hard mask 402, and the hard mask 402 is removed, yielding regions 412 of the second conductivity type which are laterally spaced apart from one another by intervening regions 414 of the drift zone realized by the base semiconductor material 400. The regions 412 of the second conductivity type and the intervening regions 414 of the drift zone collectively form a superjunction structure as previously described herein. One such region 412 of the second conductivity type and two such intervening regions 414 of the drift zone are shown in the partial cross-sectional view in FIG. 4D. In the case of the diffusion barrier structure 130 being removed from the bottom of the trenches 406 as shown in FIG. 4C, the drift zone realized by the base semiconductor material 400 contacts the bottom face 416 of the regions 412 of the second conductivity type.

FIG. 4E shows the semiconductor device after a Si epitaxial layer 418 of the first conductivity type is grown over the base semiconductor material 400 of the same conductivity type. The Si epitaxial layer 418 of the first conductivity type may be doped in situ or ex situ.

FIG. 4F shows the semiconductor device after gate trenches 420 are etched into the Si epitaxial layer 418 of the first conductivity type, a sacrificial oxide 422 is formed on the sidewalls and bottom of the gate trenches 420, and an optional implant of the first conductivity type is performed into the bottom of the gate trenches 420 to form doped regions 424 of the first conductivity type just below the gate trenches 420.

FIG. 4G shows the semiconductor device after removal of the sacrificial oxide 422 from the sidewalls and bottom of the gate trenches 420, subsequent formation of a gate oxide 426 on the sidewalls and bottom of the gate trenches 420, and formation of gate electrode 428 in the gate trenches 420. The gate oxide 426 separates the gate electrodes 428 from the surrounding semiconductor material.

FIG. 4H shows the semiconductor device after a screen oxide 430 is formed on the Si epitaxial layer 418, and after dopant species of the second conductivity type are implanted and driven into a lower part 432 of the Si epitaxial layer 418 and dopant species of the first conductivity type are implanted into an upper part 434 of the Si epitaxial layer 418. The Si epitaxial layer 418 is eventually annealed to activate the implanted dopant species of the first conductivity type to form the source region 434' of each cell and to activate the implanted dopant species of the second conductivity type to form the body region 432' of each cell. In one embodiment, the Si epitaxial layer 418 is annealed in a temperature range above 1000° C. for 30 minutes or less.

FIG. 4I shows the semiconductor device after an interlayer dielectric 436 is formed on the Si epitaxial layer 418, and after a patterned contact mask 438 such as a photoresist is formed on the interlayer dielectric. The patterned contact mask 438 has openings 440 aligned with the trenches 406 formed in the base semiconductor material 400.

FIG. 4J shows the semiconductor device after contact trenches 422 are etched into the Si epitaxial layer 418 and to the semiconductor material 412 of the second conductivity type which fills the trenches 406. The contact trench etching process etching exposes a sidewall 423 of the Si epitaxial layer 418 and of the base semiconductor material 400, and may include an anisotropic etch of the exposed part of the interlayer dielectric 436, an anisotropic etch of the exposed part of the Si epitaxial layer 418, and a lateral etch of the interlayer dielectric 436 to widen the openings formed in the interlayer dielectric 436 relative to the trenches 442 etched into the Si epitaxial layer 418. The patterned contact mask 438 is removed after the contact trenches 442 are formed.

FIG. 4K shows the semiconductor device after deposition of a spacer oxide 444 in the contact trenches 442. The spacer oxide 444 is deposited on the exposed sidewall 423 of the Si epitaxial layer 418 and of the base semiconductor material 400, and on the top surface 446 of the semiconductor material 412.

FIG. 4L shows the semiconductor device after removal of the spacer oxide 444 from the top surface 446 of the semiconductor material 412 of the second conductivity type which fills the trenches 406.

FIG. 4M shows the semiconductor device after a recess etch of the exposed top surface 446 of the semiconductor material 412 of the second conductivity type which fills the trenches 406, and after a lateral etch back of the source region 434' to create a step 448 between the source region 434' and the body region 432'. After the lateral etch back, each contact trench 422 exposes the sidewall 450 of the adjoining source region 434' and the top surface 452 of the body region 432'.

FIG. 4N shows the semiconductor device after highly doped body contact regions 454 such as p+ regions in the case of an n-channel device are formed in the exposed top surface 452 of the body region 432' and in the recessed part of the semiconductor material 412 of the second conductivity type which fills the trenches 406. The highly doped body contact regions 454 provide low ohmic contact to the adjacent semiconductor material. The device may be annealed at this time to activate all previously implanted dopants, including the source and body region dopants.

FIG. 4O shows the semiconductor device after the contact trenches 442 are filled with an electrically conductive material 456 which contacts the sidewall 450 of the source region 434' and the top surface 452 of the body region 432'. In one embodiment, the electrically conductive material 456 is formed by depositing an electrically conductive liner 458 such as a Ti or TiN liner in the contact trenches 442, subsequently filling the contact trenches with a metal 460 such as W, and planarizing the metal 460 e.g. by an etch back process. A metal layer 462 is then deposited on the interlayer dielectric 436 using a typical metal lithography process. The metal layer is in contact with the electrically conductive material 456 which fills the contact trenches 442.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a semiconductor device, the method comprising:
    forming a source region and a drain region of a first conductivity type;
    forming a body region of a second conductivity type, wherein the body region is disposed between the source region and the drain region;
    forming a gate configured to control current through a channel of the body region;
    forming a drift zone of the first conductivity type, wherein the drift zone is disposed between the body region and the drain region;
    forming a plurality of regions of the second conductivity type laterally spaced apart from one another by intervening regions of the drift zone, to form a superjunction structure; and forming a diffusion barrier structure along sidewalls of the regions of the second conductivity type of the super-junction structure, the diffusion barrier structure comprising alternating layers of Si and oxygen-doped Si and a Si capping layer on the alternating layers of Si and oxygen-doped Si.

2. The method of claim 1, wherein forming the plurality of regions of the second conductivity type and forming the diffusion barrier structure along sidewalls of the regions of the second conductivity type comprises:
etching a plurality of trenches in a first Si epitaxial layer of the first conductivity type, wherein the first Si epitaxial layer includes the drift zone;
epitaxially growing the alternating layers of Si and oxygen-doped Si on sidewalls and a bottom of the trenches;
epitaxially growing the Si capping layer on the alternating layers of Si and oxygen-doped Si; and
after forming the diffusion barrier structure, filling the trenches with epitaxial Si of the second conductivity type.

3. The method of claim 2, wherein forming the source region and the body region comprises:
after filling the trenches with the epitaxial Si of the second conductivity type, forming a second Si epitaxial layer over the first Si epitaxial layer;
implanting dopant species of the first conductivity type into a first part of the second Si epitaxial layer which corresponds to the source region;
implanting dopant species of the second conductivity type into a second part of the second Si epitaxial layer which corresponds to the body region; and
annealing the second Si epitaxial layer to activate the implanted dopant species of the first conductivity type to form the source region and to activate the implanted dopant species of the second conductivity type to form the body region.

4. The method of claim 3, wherein the drain region is disposed in a Si substrate over which the first Si epitaxial layer is formed.

5. The method of claim 3, wherein the second Si epitaxial layer is annealed in a temperature range above 1000° C. for 30 minutes or less.

6. The method of claim 3, further comprising:
planarizing the epitaxial Si of the second conductivity type before forming the second Si epitaxial layer.

7. The method of claim 3, further comprising:
etching a contact trench into the second Si epitaxial layer, the contact trench exposing a sidewall of the source region and a top surface of the body region; and
filling the contact trench with an electrically conductive material which contacts the sidewall of the source region and the top surface of the body region.

8. The method of claim 7, wherein etching the contact trench further comprises:
etching the contact trench into the first Si epitaxial layer to expose a sidewall of the first Si epitaxial layer;
depositing an insulating material on the sidewall of the body region and the sidewall of the first Si epitaxial layer; and
etching the contact trench into a region of the plurality of regions of the second conductivity type,
wherein the electrically conductive material is in contact with the region of the second conductivity type into which the contact trench is etched,
wherein sidewalls of the electrically conductive material are laterally separated from the second Si epitaxial layer and the first Si epitaxial layer by the insulating material.

9. The method of claim 2, further comprising:
removing the alternating layers of Si and oxygen-doped Si and the Si capping layer from the bottom of the plurality of trenches before filling the plurality of trenches with the epitaxial Si of the second conductivity type, so that the bottom of the plurality of trenches is uncovered when the plurality of trenches is filled with the epitaxial Si of the second conductivity type.

10. The method of claim 2, wherein filling the plurality of trenches with the epitaxial Si of the second conductivity type comprises:
selectively growing in situ doped epitaxial Si of the second conductivity type in the plurality of trenches; and
planarizing the in situ doped epitaxial Si of the second conductivity type before forming the second Si epitaxial layer.

11. The method of claim 2, wherein filling the plurality of trenches with the epitaxial Si of the second conductivity type comprises:
selectively growing epitaxial Si in the plurality of trenches;
planarizing the epitaxial Si;
implanting dopant species of the second conductivity type into the planarized epitaxial Si; and
annealing the first Si epitaxial layer to activate the implanted dopant species of the second conductivity type.

* * * * *